(12) United States Patent
Giaquinto et al.

(10) Patent No.: US 7,282,915 B2
(45) Date of Patent: Oct. 16, 2007

(54) MULTI-TURN ELEMENT RF COIL ARRAY FOR MULTIPLE CHANNEL MRI

(75) Inventors: Randy Otto John Giaquinto, Burnt Hills, NY (US); Harvey Ellis Cline, Schenectady, NY (US); Christopher Judson Hardy, Niskayuna, NY (US); Charles Lucian Dumoulin, Ballston Lake, NY (US); Paul Arthur Bottomley, Columbia, MD (US)

(73) Assignees: General Electric Company, Niskayuna, NY (US); The John Hopkins University, Baltimore, MD (US)

( * ) Notice: Subject to any disclaimer, the term of this patent is extended or adjusted under 35 U.S.C. 154(b) by 0 days.

(21) Appl. No.: 10/962,819

(22) Filed: Oct. 7, 2004

(65) Prior Publication Data

US 2005/0253582 A1  Nov. 17, 2005

Related U.S. Application Data

(60) Provisional application No. 60/572,028, filed on May 14, 2004.

(51) Int. Cl.
*G01V 3/00* (2006.01)
(52) U.S. Cl. .................... 324/318; 324/322
(58) Field of Classification Search ........... 324/318, 324/322, 314, 312, 307, 309, 300; 600/421, 600/422
See application file for complete search history.

(56) References Cited

U.S. PATENT DOCUMENTS

| 4,825,162 | A | | 4/1989 | Roemer et al. ............ 324/318 |
|---|---|---|---|---|
| 5,548,218 | A | * | 8/1996 | Lu .............................. 324/318 |
| 5,757,189 | A | * | 5/1998 | Molyneaux et al. ........ 324/318 |
| 5,905,378 | A | | 5/1999 | Giaquinto et al. .......... 324/318 |
| 6,084,411 | A | * | 7/2000 | Giaquinto et al. .......... 324/318 |
| 6,137,291 | A | * | 10/2000 | Szumowski et al. ........ 324/318 |
| 6,498,489 | B1 | * | 12/2002 | Vij .............................. 324/322 |
| 6,727,703 | B2 | * | 4/2004 | Lee ............................ 324/322 |
| 6,771,071 | B1 | * | 8/2004 | Wright et al. ............... 324/318 |
| 6,906,518 | B2 | * | 6/2005 | Leussler ..................... 324/318 |

OTHER PUBLICATIONS

Lee, Ray F., et al., "A Broadband Phased-Array System For Direct Phosphorus and Sodium Metabolic MRI on a Clinical Scanner", Magnetic Resonance in Medicine 43: pp. 269-277, 2000.
Zhu, Yudong, et al., "Highly Parallel Volumetric Imaging With a 32-Element RF Coil Array", presented in part at the 11th Meeting of International Socient for Magnetic Resonance in Medicine, Toronto, 2003.
Hardy, Christopher, et al., "Large Field-of-View Real-Time MRI with a 32-Channel System", Magnetic Resonance in Medicine 52: 2004, pp. 1-9.

\* cited by examiner

*Primary Examiner*—Louis M. Arana
(74) *Attorney, Agent, or Firm*—Jean K. Testa; Curtis B. Brueske

(57) ABSTRACT

An RF coil assembly for use in a multiple receive-channel MRI system is provided. The RF coil assembly is configured as a multi-turn-element RF coil assembly to operate as a surface-coil array in cooperation with the MRI system which is configured to operate in a multiple-channel receive mode.

23 Claims, 3 Drawing Sheets

MULTI-TURN ELEMENT RF COIL ARRAY FOR MULTIPLE CHANNEL MRI

CROSS REFERENCE TO RELATED APPLICATIONS

This application is related to Provisional Application U.S. Ser. No. 60/572,028, filed May 14, 2004, the contents of which are incorporated herein by reference, and the benefit of priority to which is claimed under 35 U.S.C. 119(e).

STATEMENT REGARDING FEDERALLY SPONSORED RESEARCH & DEVELOPMENT

The U.S. Government may have certain rights in this invention pursuant to Contract No. 8205-94734-X under 1RO1 RR15396-01 NIH/John Hopkins University.

BACKGROUND OF THE INVENTION

The invention generally relates to magnetic resonance imaging (MRI), and more particularly, to radio frequency (RF) surface coils used for MRI.

Generally, MRI is a well-known imaging technique. A conventional MRI device establishes a homogenous magnetic field, for example, along an axis of a person's body that is to undergo MRI. This homogeneous magnetic field conditions the interior of the person's body for imaging by aligning a majority of the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of RF magnetic field pulses. During the realignment process, the nuclei process about the axis of the magnetic field and emit electromagnetic signals that may be detected by one or more surface coils placed on or about the person.

Imaging time is dependent upon the desired signal-to-noise ratio (SNR) and the speed with which the MRI device can fill the k-space matrix, which is transformed to create an image. In conventional MRI, the k-space matrix is filled one line at a time. Although many improvements and variants have been made in this general area, the speed with which the k-space matrix may be filled is limited. To overcome these inherent limits, several techniques have been developed to simultaneously acquire multiple lines of data for each application of a magnetic field gradient. These techniques, which may collectively be characterized as "parallel imaging techniques", use spatial information from arrays of RF detector coils to substitute for the spatial encoding which would otherwise have to be obtained in a sequential fashion using field gradients and RF pulses.

Two such parallel imaging techniques that have recently been developed and applied to in vivo MRI are SENSE (SENSitivity Encoding) and SMASH (SIMultaneous Acquisition of Spatial Harmonics). Both techniques include the use of a plurality of separate receiving elements operated in parallel, with each element having a different or spatially translated sensitivity profile. Combination of the respective spin resonance signals detected enables a reduction of the acquisition time required for an image (in comparison with conventional Fourier image reconstruction) by a factor which in the most favorable case may equal the number of the receiving members used (see Pruessmann et al., *Magnetic Resonance in Medicine*, Vol. 42, pp. 952-962, 1999).

A drawback of the SENSE technique, for example, results when the component coil sensitivities are either insufficiently well characterized or insufficiently distinct from one another. These instabilities may manifest as localized artifacts in the reconstructed image, or may result in degraded SNR. Accordingly, it is desirable to implement RF coil arrays in MRI systems that (among other aspects) provide increased SNR with or without the use of parallel imaging techniques such as SENSE.

Additionally, image artifacts are also attributable to the mutual couplings between coils in a cluster of closely situated surface coils, which have been separately tuned and matched. The mutual couplings between the coils generate coupled modes, which cause splitting in the coils' resonant spectrum. Consequently, the coils become detuned and mismatched, causing reductions in the SNR. To sustain the SNR of the coils and avoid image artifacts caused by coil coupling, some electrical decoupling mechanisms are needed to collapse the multiple coupled modes into a single degenerate mode that resonates at the MRI frequency.

More recently, parallel imaging techniques have been further developed to exploit multiple receive channels, for example, 8, 16 or 32 channels receiving signals from 8, 16 or 32 receiver coils respectively. In a typical multiple coil array arrangement, several adjacent coils are provided for receiving signals during imaging. However, there are a number of design challenges in providing the capability of multiple receive channels and multiple coils. For example, the size of coils needed to support a 32-channel MRI system must be sufficiently small to fit within a typical 40 cm field of view of a conventional MRI system, or a smaller field of view for some applications. Additionally, the coil size and corresponding arrangement within a coil array will present inherent inductive coupling and sensitivity issues which both can negatively impact the quality (Q) and loading factors of the coils, thereby limiting overall SNR performance of the coils and MRI system during imaging. To address the size and sensitivity issues described above certain coil configurations, for example spiral or multiple-looped coils, have been used in coil arrays designed for magnetic resonance operating below 30 MHz. There is now an increased need for additional receive channels and MRI system capability at higher frequencies, especially but not limited to 64 MHz and 128 MHz corresponding to 1.5 T and 3 T systems, respectively. However, spiral or multiple-looped coils used in MRI systems operating at or above 30 MHz may negatively impact the overall performance of the coils and MRI system during imaging.

The loading factor is the ratio of unloaded Q to loaded Q (when the coil is loaded by being placed on the subject), where the quality factor Q is a measure of the coil resonance frequency divided by the band-width of the coil resonance, as is known to those skilled in the art. The loading factor serves as a measure of the ratio of total resistive losses arising from the coil and the imaging subject divided by the losses from the coil alone. High loading factors generally mean that most of the noise is coming from the subject, not the coil, and in the absence of strong E-field coupling between the coil and the sample, are generally interpreted as a sign of good coil performance.

What is needed is a highly coupled RF coil assembly having high Q and high loading factor MRI coils for use in a multi-channel MRI system operating at higher frequencies.

BRIEF DESCRIPTION OF THE INVENTION

An RF coil assembly for use in a multiple receive-channel MRI system is provided. The RF coil assembly is configured as a multi-turn element RF coil assembly to operate as a surface-coil array in cooperation with the MRI system which is configured to operate in a multiple-channel receive mode.

In a first aspect, a radio frequency (RF) coil assembly for use in a magnetic resonance imaging (MRI) system comprises a plurality of multi-turn coil elements for receiving RF signals during imaging wherein the multi-turn coil elements are adapted to couple to a corresponding plurality of receive channel preamplifier inputs in the MRI system.

In a second aspect, a radio frequency (RF) coil assembly for use in magnetic resonance imaging (MRI) comprises an RF coil array that comprises a plurality of multi-turn coil elements for receiving RF signals during imaging wherein the multi-turn coil elements are adapted to couple to a corresponding plurality of receive channels in the MRI system.

DETAILED DESCRIPTION OF THE INVENTION

Figure 1:
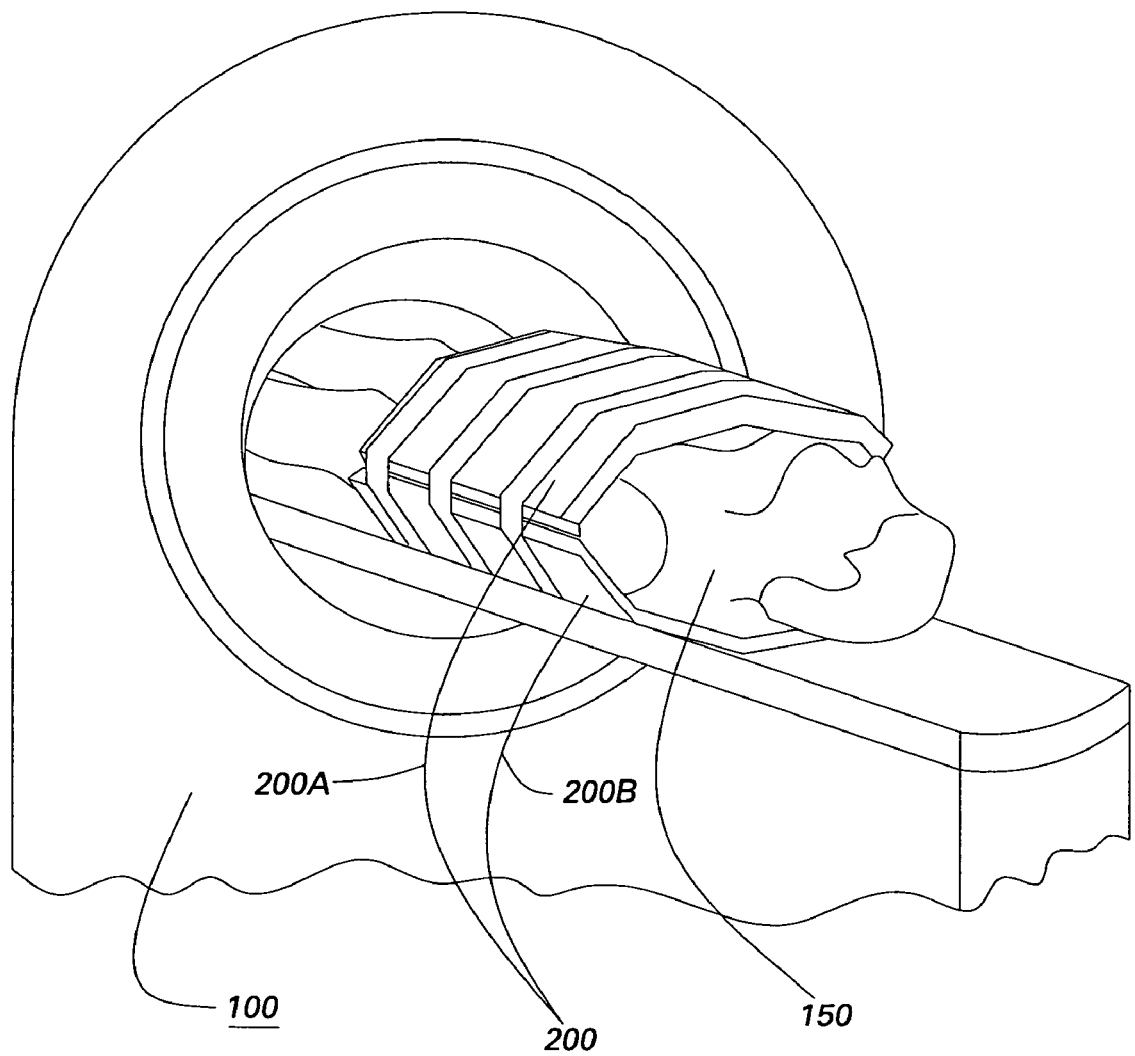
FIG. 1 is an illustration of an exemplary MRI system in which embodiments of the present invention are applicable.

Referring initially to FIG. 1, an exemplary magnetic resonance imaging (MRI) system 100 is shown. MRI system 100 operates in a well-known manner and includes a computer, which controls gradient coil power amplifiers through a pulse control subsystem. The pulse control subsystem and the gradient amplifiers together produce the proper imaging gradient waveforms Gx, Gy, and Gz, for example, for a spin echo, a gradient recalled echo pulse sequence, a fast spin echo, or for other types of pulse sequences as are known to those skilled in the art. The gradient waveforms are connected to gradient magnetic field coils, which are positioned around the bore of an MR magnet assembly so that gradient magnetic fields $Gx=\delta B_0/\delta x$, $Gy=\delta B_0/\delta y$, and $Gz=\delta B_0/\delta z$, are impressed on the polarizing magnetic field $B_0$ from the MR magnet assembly.

The pulse control subsystem also controls a radio frequency synthesizer that is part of an RF transceiver system. The pulse control subsystem also controls an RF modulator, which modulates the output of the radio frequency synthesizer. The resultant RF signals, amplified by a power amplifier and applied to an RF coil assembly through a transmit/receive switch, are used to excite the nuclear spins of an object 150 to be imaged within the MRI system.

In a well-known manner, the MR signals from the excited nuclei of the imaged object are picked up by an RF receive coil assembly and presented to a preamplifier through the transmit/receive switch, to be amplified and then processed by a quadrature phase detector, or by a digital receiver as is known to those skilled in the art. In either case, the detected signals are digitized by a high speed A/D converter and applied to the computer for processing to produce MR images of the object. The computer may also control shimming power supplies used to optimize the magnet homogeneity (when the imaging gradients are off) via a shim coil assembly.

In embodiments of the present invention, RF coil assembly 200 comprises at least one of an upper coil assembly 200A and a lower coil assembly 200B which are attached to form an assembly that will fit around the torso of the subject or object 150 to be imaged. The upper and lower coil assemblies are identical and will be discussed in further detail with reference to FIGS. 2 and 3. A surface coil is well-known in MRI and is a receive only RF imaging coil which, in general, fits against the surface of the object being imaged. In the embodiment shown in FIGS. 1 and 2, multi-turn-element RF coil assembly 200 is a full torso coil array, but it is to be appreciated that the invention is also applicable and can be modified to suit other surface coil applications, including but not limited to partial body coils, chest coils, cardiac coils and appendage (arm or leg) coils. In other embodiments, the coils are fabricated from a thin electrical conductor such as a copper strip or foil or silver, gold or copper plated metal, and mounted on a flexible substrate which is conformed to the subject, or are fabricated from a flexible printed circuit board. The description of RF coil assembly 200 will be made in greater detail with reference to FIGS. 2 and 3.

In embodiments of the present invention, an RF coil assembly configured for use in an MRI system operating at high frequencies is provided. As used herein, high frequency refers to greater than 30 MHz. Additionally in embodiments of the present invention, it is desirable to implement a multiple channel array for the receive coil assembly. In so doing, a parallel processing technique such as SENSE (described above) may then be used to improve data acquisition time. At relatively high $B_0$ field strengths (e.g., >3 T), the electrical properties and size of the patient also affect the homogeneity of the RF excitation field. However, if the transmit coil was also implemented in an array configuration, then the current amplitude and phase in each array element could be individually regulated to compensate, at least in part, for the variations in RF excitation field associated with the electrical properties of the patient.

Figure 2:
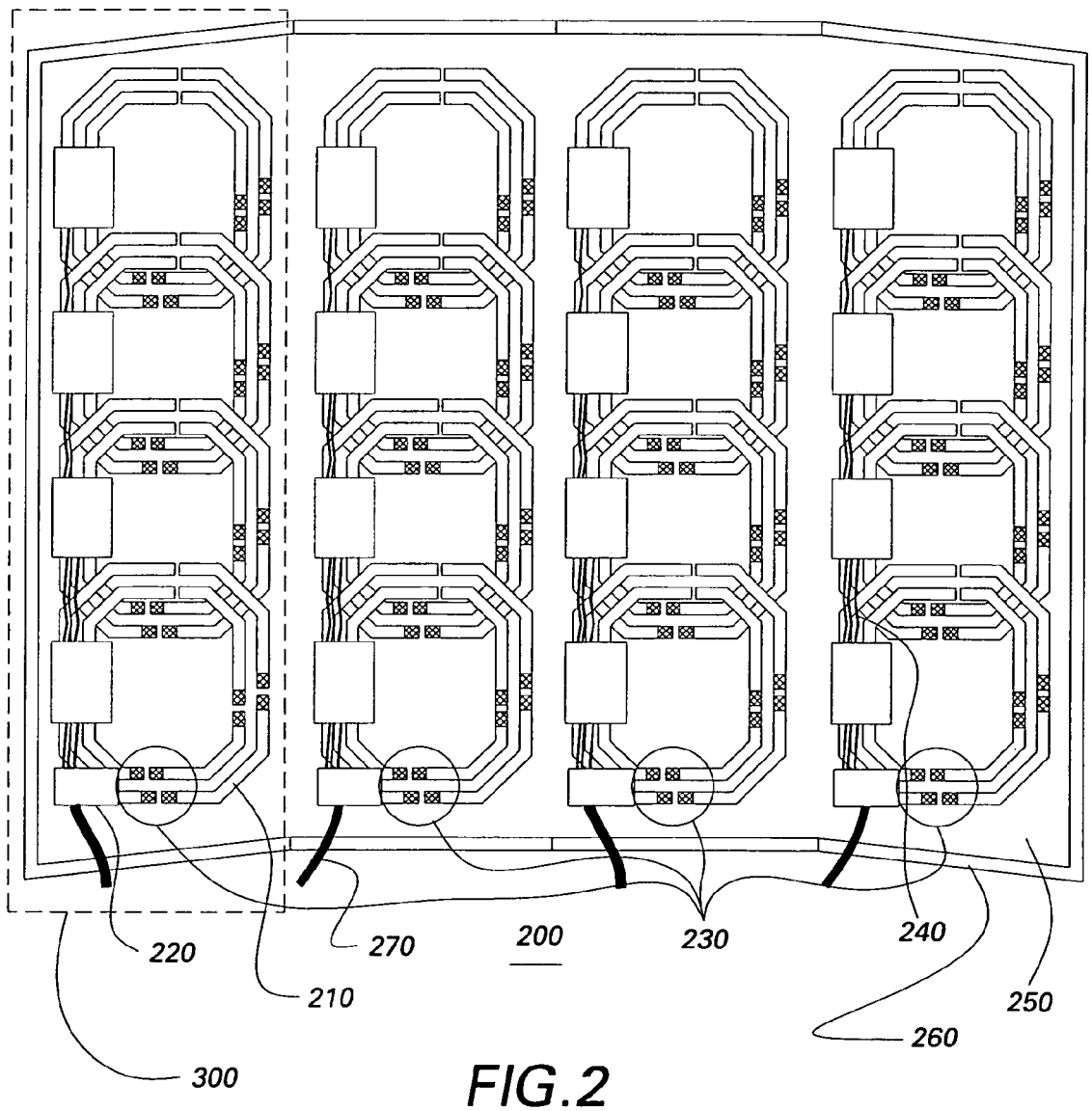
FIG. 2 is a schematic block diagram of an embodiment of a multi-turn element RF coil assembly; and, FIG. 3 is a schematic diagram of a coil used in the RF coil assembly of FIG. 2.

Referring now to FIG. 2, an exemplary embodiment of either the upper or lower coil assembly of multi-turn element RF coil assembly 200 is shown in more detail. As described with reference to FIG. 1, RF coil assembly 200 comprises an upper coil assembly and a lower coil assembly which are attached in a manner to fit around the torso of a subject to be imaged. The upper and lower coil assemblies are identical and are represented by the schematic as shown in FIG. 2. In this embodiment, RF coil assembly 200 is configured as a torso surface coil array. It is to be appreciated that the size and arrangement of the coils and components can be modified for other surface coil applications.

Referring further to FIG. 2, the upper or lower assembly of the RF coil assembly 200 is shown. Each of the upper and lower assemblies of the RF coil assembly 200 comprise a set of multi-coil subassemblies 300. Each multi-coil subassembly 300 comprises a plurality of multi-turn coil elements 210 where the number of elements per subassembly 300 is selected based upon the number of desired receiver channels (for example, a 32-channel receiver capability will require a total of 32 multi-turn coil elements on the RF coil assembly with 16 on the upper coil assembly and 16 on the lower coil assembly), a corresponding number of balun assemblies 220 for each coil element 210, and a plurality of distributed capacitors 230 positioned selectively about each coil element 210. The values of the distributed capacitors are adjusted so as to tune each coil element to the MRI frequency with all the coil assemblies assembled and with the sample or subject present in the sample space. As such, the multi-turned coil elements are tuned via the distributed capacitors 230 to cause each and every coil element to resonate at a frequency corresponding substantially to the MRI frequency of the MRI system when the system is loaded with the subject. In this exemplary embodiment, four (4) multi-turn element coils are positioned on each subassembly 300 as shown in FIG. 2 wherein each coil is overlapped to an extent with an adjacent coil, and the extent of overlap is adjusted so as to minimize mutual electromagnetic coupling between pairs of coils. Four subassemblies 300 are combined to form an upper or lower assembly of the RF coil assembly 200. Each subassembly 300 further includes cables 240 coupled to each multi-turn element coil and balun assembly for connection to the MRI system 100 of FIG. 1 and the multiple cables 240 are desirably routed through tubing 270 to consolidate the number of connections to the preamplifier inputs of the MRI system's receiver. In this embodiment, the balun assemblies 220 comprise LEXAN blocks housing the cables 240, a balun PC board (not shown) which contains blocking coils, pin diodes, and the balun which are provided in a well-known manner. Further, cables 240 are turned to lambda/2 through the balun, and then bunched in silicone heat shrink and convoluted TEFLON tubing as four discrete cables (shown as tubing 270) of eight.

Referring again to FIG. 2, in this exemplary embodiment, two arrays (upper and lower coil assemblies) each consist of sixteen multi-turn element coils, four per subassembly 300. One array (upper 200A) is designed for the patient's chest and the other array (lower 200B) is designed for the patient's back. Assembling the upper and lower arrays forms a 32-channel flexible array. Each of the upper and lower assemblies forming the RF coil assembly 200 consists of sixteen multi-turn element coils 210 in which four multi-turn element coils are placed on a corresponding subassembly 300 and four subassemblies 300 are electrically and mechanically connected to form a sixteen coil array. The subassemblies 300 are electrically connected through the cables 240 as described above. The subassemblies are mechanically coupled by attaching each of the four subassemblies 300 onto a sheet or substrate 250, for example LEXAN plastic having a thickness of 0.030 inch. Other materials and thicknesses may be used. The sheet or substrate is desirably sufficiently flexible so that the upper coil assembly of RF coil assembly 200 may be bent slightly or flexed to be placed comfortable on a patient or subject's (150 in FIG. 1) chest and the lower coil assembly of RF coil assembly 200 may be flexed to be comfortably rested upon by a patient's back, and further both the upper and lower coil assemblies form a structure that envelops the patient to ensure full coverage of the torso with minimal interference to the MRI system from the air surrounding the patient's body. In the embodiment shown, the sheet 250 is bent slightly to form four locations for four subassemblies 300. RF coil assembly 200 further includes a cover 260 to which to attach the sheet 250 containing the subassemblies 300 and to provide an external protective cover for the RF coil assembly 200. Cover 260 is desirably constructed of a flexible foam to permit ease of handling by the user of the MRI system in placing the RF coil assembly 200 on and around the patient. Further, cover 260 desirably includes an external covering over the foam to protect all of the components of the RF coil assembly 200. For this exemplary embodiment, the RF coil assembly 200 when fully constructed is desirably 42 cm in length to correspond to the field of view of a conventional MRI imaging system.

As described above, an RF coil assembly 200 is suitable for torso imaging in a multiple receive channel (i.e. 32) MRI system. If other imaging applications or field of view requirements are desired, the length of the RF coil assembly 200 may be modified to suit the desired field of view. Alternatively, the number and/or size of coils comprising the array can be modified.

Figure 3:
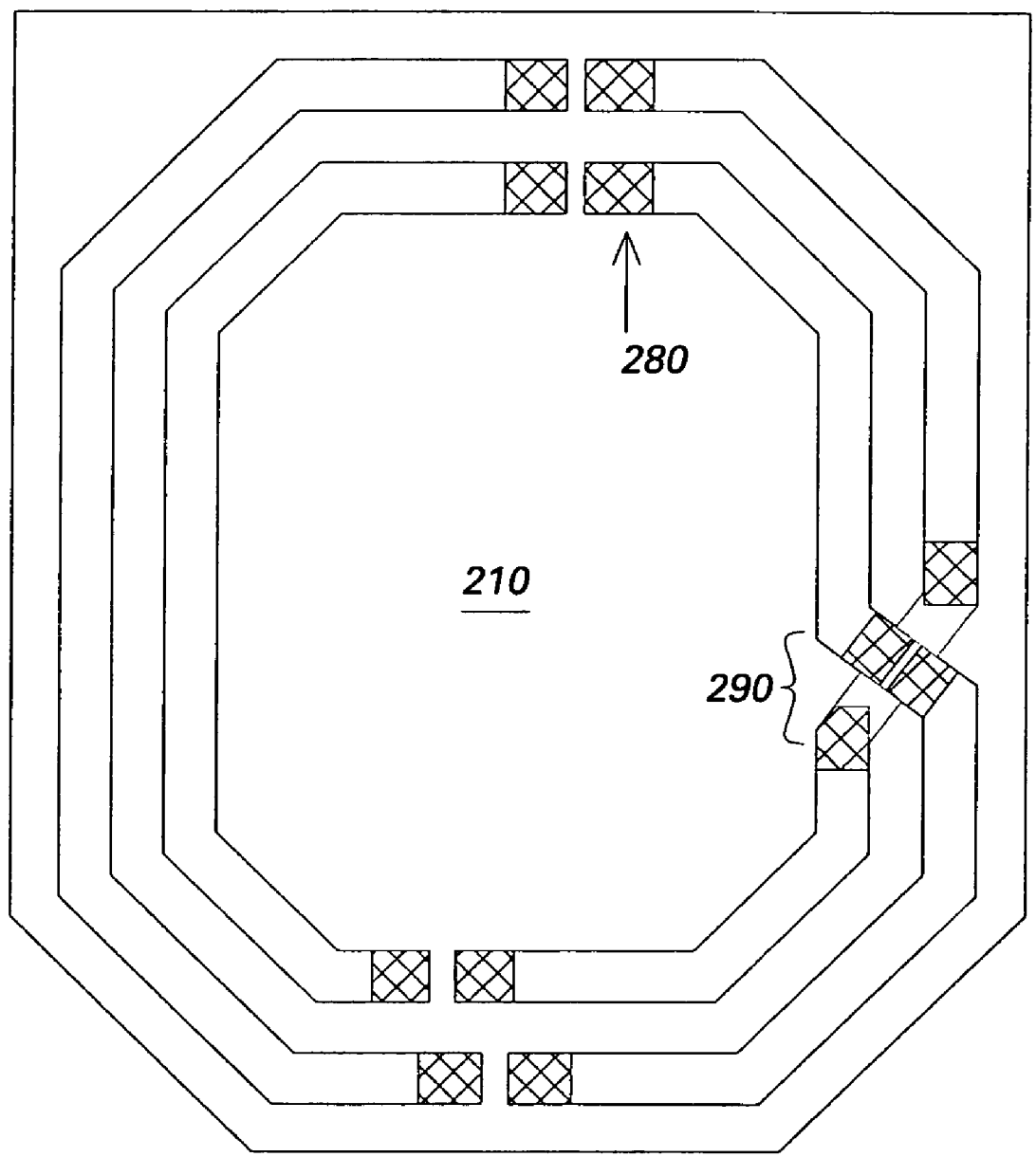

Referring now to FIG. 3, a multi-turn element coil 210 is shown. As described above with respect to the exemplary embodiment, there are 32 multi-turn coil elements 210. Each multi-turn coil element 210 is desirably a multiple turned multiple loop of conductive material suitable for use in an MRI system, for example copper. Other materials suitable for use in MRI systems may be used, but copper was used in this embodiment for its ease of manufacturing and for cost considerations. In an exemplary embodiment, a double loop as shown in FIG. 3 is used. Each of the element coils 210 has a dimension of 11.9 cm×10.7 cm (measurement between loops) and the dimension is selected based upon the desired application, torso imaging and thus a 42 cm field of view, and number of receive-channels (32). In this embodiment, the size of the coils is selected in order to fit a total of 16 coils 210 on a substrate not exceeding the 42 cm field of view requirement of a convention MRI scanner. Of course, other applications would balance the field of view, then number of receive-channels to determine the size and number of loops of the coil elements needed. Referring again to FIG. 3, the coil element 210 is shown with a double loop. In the exemplary embodiment, each multi-turn coil element was etched onto a 6 oz., 0.021 inch circuit board using computer-aided design (CAD) and a loop is obtained at cross-over point 290. Each coil 210 was individually fabricated and tuned and then each subassembly 300 (FIG. 2) was constructed by gluing coil elements 210 in an overlapped manner to achieve the desired coupling factor for use as a multi-coil array in the MRI system. Coil elements 210 further include a plurality of contact points 280 for use in attaching capacitors (shown as 230 in FIG. 2). Referring again to FIG. 3, the conductor comprising coil element 210 is depicted as octagonal in shape. It is understood that this shape is depicted as an example only and that many other shapes are envisaged and included within the scope of this invention, including specifically circular loops, square loops, rectangular loops, and n-sided polygons wherein $n \geq 3$.

In operation, the exemplary embodiment as shown in both FIGS. 1 and 2 demonstrated a loading factor in the range of 2-3:1. Each multi-turn coil element 210 was tuned to minimize coil coupling for the condition when the RF coil assembly 200 would be flexed around the patient. It is desirable that tuning be insensitive to the flexing of the RF coil assembly so that the RF coil assembly is operable for a variety of body sizes.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A radio frequency (RF) coil assembly for use in a magnetic resonance imaging (MRI) system comprising:
   a plurality of multi-turn coil elements for receiving RF signals during imaging wherein the multi-turn coil elements are adapted to connect to a corresponding plurality of receive channels in the MRI system operating at frequencies greater than 30 MHz, the multi-turn coil elements each include an inner loop and an outer loop and the inner loop is disposed within the outer loop and coupled to the outer loop in at least one location to form a multiple turned multiple looped structure;

wherein the multi-turn coil elements and the receive channels correspond in number and the multi-turn coil elements are arranged to overlap with respective adjacent multi-turn coil elements such that the inner and outer loops of each multi-turn coil element overlap with the inner and outer loops of an adjacent multi-turn coil element and the multi-turn coil elements are arranged to correspond to a desired field of view within the MRI system.

2. The RF coil assembly of claim 1 wherein the multi-turn coil elements are arranged electrically and mechanically to form an RF coil array.

3. The RF coil assembly of claim 1 wherein the multi-turn coil elements comprise conductive material suitable for use in the MRI system.

4. The RF coil assembly of claim 1 further comprising a corresponding number of balun assemblies and a corresponding number of distributed capacitors positioned selectively about each of the multi-turn coil elements.

5. The RF coil assembly of claim 4 wherein the multi-turn coil elements are overlapped to minimize mutual electromagnetic coupling between the multi-turn coil elements.

6. The RF coil assembly of claim 5 wherein the multi-turned coil elements are turned via the distributed capacitors to cause each multi-turn coil element to resonate at a frequency corresponding substantially to an MRI frequency of the MRI system when the assembly is loaded with a subject to be imaged.

7. The RF coil assembly of claim 1 wherein the multi-turn coil elements each comprise at least one multiple turned loop of conductive material suitable for use in the MRI system.

8. The RF coil assembly of claim 7 wherein the multi-turn coil elements are fabricated using computer-aided design.

9. A radio frequency (RF) coil assembly for use in magnetic resonance imaging (MRI) comprising:

an RF coil array that comprises a plurality of multi-turn coil elements for receiving RF signals during imaging wherein the multi-turn coil elements are adapted to connect to a corresponding plurality of receive channels in an MRI system operating at frequencies greater than 30 MHz, the multi-turn coil elements each include an inner loop and an outer loop and the inner loop is disposed within the outer loop and coupled to the outer loop in at least one location to form a multiple turned multiple looped structure;

wherein the multi-turn coil elements and the receive channels correspond in number and the multi-turn coil elements are arranged to overlap with respective adjacent multi-turn coil elements such that the inner and outer loops of each multi-turn coil element overlap with the inner and outer loops of an adjacent multi-turn coil element and the multi-turn coil elements are arranged to correspond to a desired field of view within the MRI system.

10. The RF coil assembly of claim 9 wherein the RF coil array comprises a flexible substrate for disposing the multi-turn coil elements thereon.

11. The RF coil assembly of claim 9 wherein the multi-turn coil elements comprise conductive material suitable for use in the MRI system.

12. The RF coil assembly of claim 9 further comprising a corresponding number of balun assemblies and a corresponding number of distributed capacitors positioned selectively about each multi-turn coil element.

13. The RF coil assembly of claim 12 wherein corresponding values of the distributed capacitors are adjusted to cause each multi-turn coil element to resonate at a frequency corresponding substantially to an MRI frequency of the MRI system when the assembly is loaded with a subject to be imaged.

14. The RF coil assembly of claim 9 wherein an extent of overlap is adjusted to minimize mutual electromagnetic coupling between the multi-turn coil elements.

15. The RF coil assembly of claim 9 wherein the RF coil assembly is mechanically coupled to a substrate and the substrate is adapted to be positioned about a subject to be imaged.

16. The RF coil assembly of claim 15 wherein the substrate is flexible and is substantially conformable to a shape of the subject to be imaged.

17. The RF coil assembly of claim 16 further comprising at least two conformable coil assemblies wherein each coil assembly is conformed to a different portion of the subject to be imaged.

18. The RF coil assembly of claim 9 wherein the multi-turn coil elements each comprise a multiple turned loop of conductive material suitable for use in the MRI system.

19. In a magnetic resonance imaging system that includes receive channels that operate above 30 MHz, a radio frequency coil assembly that receives radio frequency signals from a patient while conformed to the patient during imaging of the patient, the coil assembly comprising:

a coil array that arranges coil elements in rows and columns, wherein the coil elements are each connected to a separate receive channel and each include an inner loop and an outer loop, the inner loop is disposed within the outer loop and coupled to the outer loop in at least one location to form a multiple turned multiple looped structure, and the inner and outer loops of each coil element overlap the inner and outer loops of an adjacent coil element in the same column and do not overlap the inner and outer loops of an adjacent coil element in the same row.

20. The coil assembly of claim 19 wherein the coil elements overlap to minimize mutual electromagnetic coupling therebetween.

21. The coil assembly of claim 19 wherein the coil elements are identical.

22. The coil assembly of claim 19 wherein the coil elements each have an octagonal shape.

23. The coil assembly of claim 19 wherein the coil elements are each connected to a corresponding balun assembly and a corresponding distributed capacitor.

* * * * *

UNITED STATES PATENT AND TRADEMARK OFFICE
CERTIFICATE OF CORRECTION

PATENT NO.         : 7,282,915 B2                                      Page 1 of 1
APPLICATION NO.    : 10/962819
DATED              : October 16, 2007
INVENTOR(S)        : Randy Otto Giaguinto et al.

It is certified that error appears in the above-identified patent and that said Letters Patent is hereby corrected as shown below:

Col. 1, under
STATEMENT REGARDING FEDERALLY SPONSORED RESEARCH & DEVELOPMENT insert This invention was made with Government support under Contract No. 1 R01 RR15396-01 awarded by NIH. The Government has certain rights in the invention.

Signed and Sealed this

Twenty-sixth Day of February, 2008

JON W. DUDAS
*Director of the United States Patent and Trademark Office*